Figure 1:
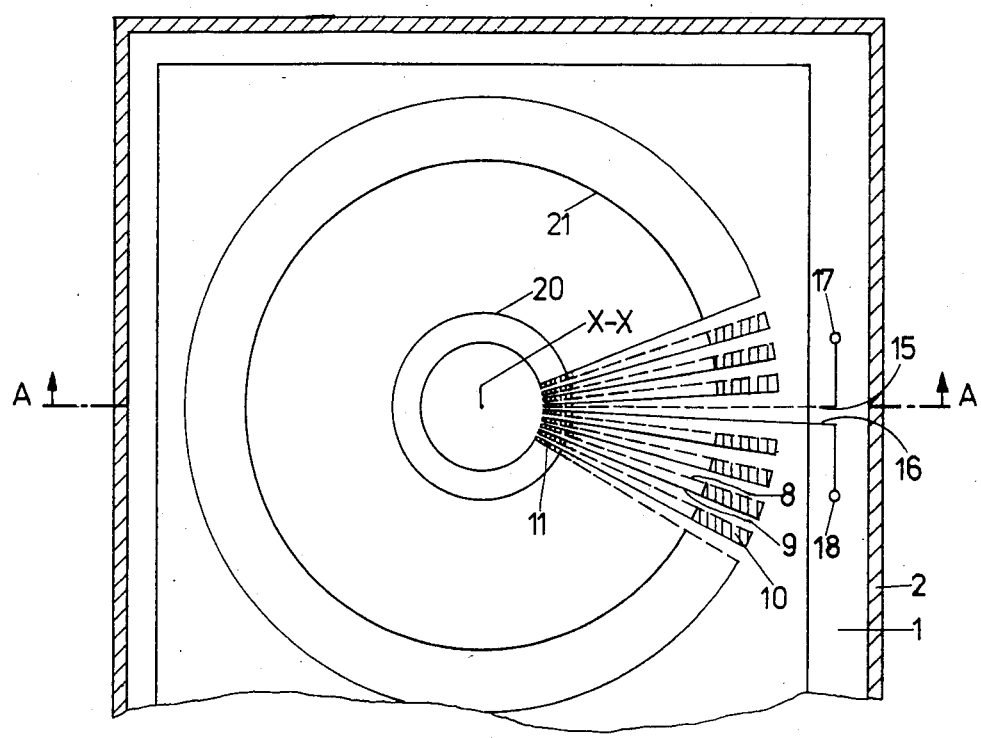

United States Patent [19]

Elbel et al.

[11] Patent Number: 4,665,276
[45] Date of Patent: May 12, 1987

[54] THERMOELECTRIC SENSOR

[75] Inventors: Thomas Elbel; Jürgen Müller; Friedemann Völklein, all of Jena, German Democratic Rep.

[73] Assignee: Kombinat VEB Keramische Werke Hermsdorf, Hermsdorf, German Democratic Rep.

[21] Appl. No.: 671,664

[22] Filed: Nov. 15, 1984

[30] Foreign Application Priority Data

Dec. 6, 1983 [DD] German Democratic Rep. ... 257533

[51] Int. Cl.⁴ ............................................. H01L 37/00
[52] U.S. Cl. ..................................... 136/215; 136/214
[58] Field of Search ................................ 136/211–215, 136/225; 250/330, 332; 73/DIG. 4, 11

[56] References Cited

U.S. PATENT DOCUMENTS

| 2,422,273 | 6/1947 | Wannamaker | 136/215 |
| 2,561,077 | 7/1951 | Tilton | 136/215 |
| 2,696,117 | 12/1954 | Harrison | 136/215 |
| 3,424,624 | 1/1969 | Villers et al. | 136/213 |
| 4,111,717 | 9/1978 | Baxter | 136/213 |
| 4,211,888 | 7/1980 | Stein et al. | 136/215 |

Primary Examiner—Deborah L. Kyle
Assistant Examiner—T. J. Wallen
Attorney, Agent, or Firm—Jordan and Hamburg

[57] ABSTRACT

This invention concerns a thermoelectric sensor of the air-backed type comprising a thin-film thermopile with a receiving area of approximately 1 mm² under a protective atmosphere of atmospheric pressure. To increase the responsivity of such sensors the sensing junctions of at least 25 thermocouples whose legs have comparable coefficients of thermal conductivity are arranged in the receiving area with the legs having an average breadth-to-length ratio of at least 1:20.

4 Claims, 3 Drawing Figures

THERMOELECTRIC SENSOR

This invention relates to a thermoelectric sensor for the detection of electromagnetic radiation. There is a principal difference between several types of thermoelectric sensors, as to whether:

their functional elements are arranged on a heat sink with a large thermal mass or a free-standing film with a small thermal mass (air-backed type), the functional elements consist of bulk material (e.g. in the shape of small pins or thin wires) or of thin films, or the functional elements are encapsulated in an evacuated package or in a package filled with protective gas.

The present wide-spread interest in largely miniaturized and at the same time highly sensitive thermoelectric sensors has led to the development of a sensor type with free-standing membrane which is realized by thin-film technology and encapsulated in a standard transistor package with protective atmosphere.

Known thermoelectric detectors of this type are, for instance, hermetically encapsulated in TO-5 packages with a protective nitrogen, argon or xenon atmosphere with atmospheric pressure. Thermoelectric sensors with a size of the receiving area of approximately 1 mm×1 mm or 1 mm in diameter produced by thin-film technology with 6 to 15 single thermocouples of different configuration connected in series reach typical responsivities of 7–23.5 V/W (Wollman, L. R.: Electro-Optical Systems Design, September 1979, p. 37–44).

In the endeavour to have available devices of still higher responsivity for noncontact temperature measurement, for gas analysis or for intrusion detectors and safety equipments there is a high interest in thermoelectric sensors with high responsivity.

It is an object of the invention to provide a thermoelectric sensor of the air-backed type with a receiving area in the magnitude of one square millimeter working, with gas filling under atmospheric pressure and using thin-film technology which has a higher responsivity than comparable sensors.

It is a further object of the invention to provide a thermoelectric sensor that can reach a responsivity of at least 35 V/W by using conventional materials for the thermocouples with a novel shaping of said thermocouples and by simultaneously adhering to the required minimum number of thermocouples for the sensor type in question.

According to the invention this object is attained by using thermocouples whose legs have coefficients of thermal conductivity comparable with one another and by arranging a minimum number of 25 thermoelectric pairs on the receiving area with each leg having a ratio of leg length to leg breadth of at least 20, particularly between 20 and 30, preferably 27. The thermoelectric sensor according to the invention can be produced by known vacuum deposition methods and photolithographic structuring methods which are described in "Optical Radiation Measurements" (Ed. F. Grum, C. J. Bartleson), Vol. 4, W. Budde "Physical Detectors of Optical Radiation", Academic Press New York, London etc. 1983, Chapter 4.

By using the means proposed in the invention it is possible to increase the responsivity of the proposed sensor type in a surprisingly simple way to 35 V/W using known thermoelectric materials and in itself known sensor designs of the air-backed type with gas filling under atmospheric pressure with a receiving area in the magnitude of one square millimeter. Already with 25 thermoelectric couples only it is possible under suitable protective-gas filling to reach responsivities of 50 V/W. It should be emphasized that it is as well within the scope of the invention that not each leg is given the ratio of leg length to leg breadth according to the invention. It may be necessary, e.g. for reasons of contacting, to dimension a small number of the legs in a different way. It is essential that the majority of the legs be given the ratio according to the invention. Compared to the attainable increase of responsivity the production-technological expense is relatively low.

Figure 2:
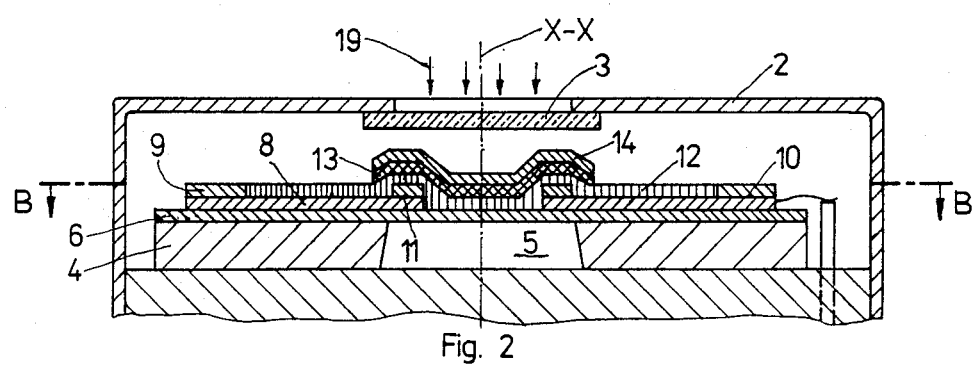
Figure 3:
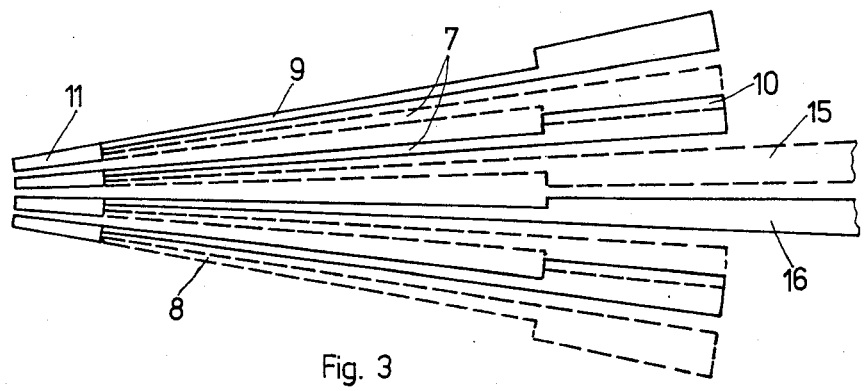

The invention will now be described in detail by means of a representative embodiment which is explained by the enclosed schematic drawings which are not true to scale. In these drawings:

FIG. 1 is essentially a plan view of a thermoelectric sensor in the form of a thermopile; for clarification of the essential active elements a section is made along the line B—B in FIG. 2. The lower part of the thermopile below the sinuous line was omitted because it is virtually identical with the given upper part, FIG. 2 is a cross-sectional view of the thermopile along line A—A in FIG. 1 and FIG. 3 is an enlarged top plan view of the thermocouples in the vicinity of the electrical terminals in FIG. 1.

On a base 1 of a TO-5 package can 2 the rest of which is filled with protective gas or evacuated, with a window 3 made of potassium bromide permeable for an electromagnetic radiation 19 to be detected, a substrate 4 made of silicon and acting as thermal sink with a central aperture 5 is provided whose upper surface including aperture 5 is covered and spanned by a membrane 6 made of silicon nitride ($Si_3N_4$) and/or silicon dioxide ($SiO_2$). Thermocouples 7 are attached to the membrane 6 in a radially symmetrical way, each consisting of two legs 8, 9 contacting each other at their outer ends in reference junctions 10 and at their inner ends with the preceding or the following thermocouple respectively in sensing junctions 11. The reference junctions 10 are situated on the substrate 4, the sensing junctions 11 below the window 3 on the aperture 5. Above the aperture 5 the thermocouples 7 and the membrane 6 are covered with an electrically insulating layer 12, an isothermal collector layer 13 and a metal black absorber coating 14, one above the other. Two legs 15, 16 of the thermocouples 7 lead to the terminals 17, 18 of an indicating instrument (voltmeter) which is not further shown. The window 3, the layer sequence 12, 13, 14 and the aperture 5 are arranged and aligned with each other in a way that the electromagnetic radiation 19 entering through the window 3 is effective in the sensing junctions to a maximum. The radiation 19 entering through the window 3 is concentrated by the layers 12, 13, 14 to the sensing junctions 11 and generates in them a voltage which is transmitted to the terminals 17, 18.

The thermopile has fifty thermocouples, some of which are shown in FIG. 1, the others being indicated by circles whose sensing junctions 11 subjected to the radiation to be measured 19 are situated at a distance of 0.565 mm and whose reference junctions 10 are not influenced by the radiation 19 at a distance of 1 mm from the centre X—X of the thermopile. Therefore, the legs 8, 9, have a length of 0.435 mm but not the legs 15, 16. A circular line 20 on which the outer limitations of the sensing junctions 11 are situated limits the effective sensing area of 1 mm² subjected to the electromagnetic radiation to be measured. The legs 8, 9 consist of a possible and usual combination of antimony and a bismuth$_{0.9}$ antimony$_{0.1}$ alloy respectively. They have a breadth of 0.016 mm, so that their ratio of length to breadth is 27. The length of the legs 8, 9 is the distance between the sensing junctions 11 and the reference junctions 10, or using the designations in FIG. 1, between the circles 20 and 21 determining the loci for all outer limitations of the sensing junctions 11 and all inner limitations of the reference junctions 10 respectively. The breadth of of the legs 8, 9 is their dimension at right angles to the length in parallel to the plane of the paper in FIGS. 1 and 3.

The layer thicknesses of the legs 8, 9, and 15, 16 are designed in a way that both legs of one thermocouple 7 each have the same magnitude of the coefficient of thermal conductivity, considering the coupled materials. For the combination bismuth-antimony layer thicknesses of 200 nm for antimony and 400 nm for bismuth are most suitable. If antimony telluride and bismuth telluride are combined instead of bismuth and antimony, suitable layer thicknesses are 800 nm for $Sb_{1.5}Bi_{0.5}Te_3$ and 560 nm for $Bi_2Sb_{0.3}Te_{2.7}$.

In the case of fifty thermocouples, a length-to-breadth ratio of 27 and a radiation-absorbing sensor area of 1 mm² the thermopile according to the invention can reach a responsivity of 100 V/W, which is far higher than the responsivity of known thermopiles and which is due to both the proportioning of the legs 8, 9 and their number under consideration of the effective sensor area.

The responsivity to be reached within the scope of the invention is dependent on the number of the thermocouples 7, which should be between 25 and 100, and the ratio of length to breadth of the legs, which is for the majority of these legs between 20 and 30:1. For a hermetically sealed package 2 filled with a protective gas and situated between the window 3 made of potassium bromide and the metal black absorber coating 14 the responsivities given in the following table have been reached, depending on the number of thermocouples and on the length-to-breadth ratio of the legs.

| Number of thermocouples | Responsivity [V/W] with length/ breadth | | |
|---|---|---|---|
| | 20 | 27 | 30 |
| 25 | 22 | 24 | 21 |
| | (53) | (58) | (50) |
| 50 | 38 | 42 | 38 |
| | (91) | (100) | (91) |
| 70 | 52 | 56 | 54 |
| | (125) | (134) | (130) |

The responsivities not given in brackets refer to packages 2 filled with argon as protective gas, and the responsivities given in brackets to packages filled with xenon. A responsivity of 84 V/W was reached with the protective gas Freon 12 ($CF_2Cl_2$) with 50 thermocouples and a length-to-breadth ratio 27:1, the other conditions being the same as above mentioned.

The substrate 4 can be made of ceramics, metal or glass. For the membrane 6 the material can also be chosen arbitrarily, e.g. a metal oxide which is electrically insulating, ensure a sufficient adherance of the legs 8, 9, 15, 16 to the substrate 4 and is suited to span the aperture 5 in the substrate without breakage. For the layer sequence 12 it is important that it receives as much as possible of the radiation to be measured and leads it to the sensing junctions 11 and that their metal layers are electrically well insulated from the legs 8, 9. The thin layers of the legs 8, 9, 15, 16, of the layer sequence 12, 13, 14 and of the membrane can be produced by a usual evaporating or sputtering method.

The deposition of the thermocouples 7 is not bound to the circular shape. They can also be arranged laterally in the form of elements that meander over a rectangular aperture below a rectangular window (U.S. Pat. No. 3,715,288, Ojars Risgin).

It is also possible to arrange the thermocouples 7 in a radially symmetrical form between a window and an aperture which are both approximately rectangular. In this case the legs are longer in the direction to the corners of the square than in the centre of the edges of the square. In order to keep the length-to-breadth ratio constant for all legs, the breadth of the legs should be varied accordingly. Investigations have shown, however, that it is sufficient when the average length-to-breadth ratio is within the limits stipulated by the invention or when the length-to-breadtth ratio is generally observed by the majority of the legs 8, 9.

We claim:

1. Thermoelectric sensor for the detection of electromagnetic radiation, comprising a substrate having an aperture,
    a membrane being on, and in contact with, said substrate, said membrane also spanning said aperture,
    25 to 100 thermocouples on said membrane,
    each thermocouple having two legs,
    said two legs contacting each other in a reference junction over said substrate,
    each of said legs contacting one leg of its neighbouring thermocouple in a sensing junction above said aperture,
    the sensing junctions of all said thermocouples determining the radiation-absorbing area of said sensor,
    the average length of all legs between their sensing junctions and their reference junctions being 20 to 30 times as large as their breadth,
    and electrical terminals for an indicating instrument, the first and the last of said legs being for connection of the first and the last of said sensing junctions and said reference junctions respectively with said electrical terminals.

2. Thermoelectric sensor as claimed in claim 1 wherein the average length of said legs is 27 times as large as their breadth.

3. Thermoelectric sensor as claimed in claim 2, wherein said substrate is attached to a base plate of a package having a top plate with a window being over said aperture, said package being filled with an atmosphere, said atmosphere and said window being permeable to said electromagnetic radiation.

4. Thermoelectric sensor as claimed in claim 3, wherein a heat conducting metal coating is situated on said thermocouples over said aperture and is electrically insulated from said thermocouples.

* * * * *